(12) United States Patent
Hall

(10) Patent No.: US 8,269,507 B2
(45) Date of Patent: Sep. 18, 2012

(54) DEVICE FOR TESTING SURFACE MOUNTED CONNECTORS

(76) Inventor: James Hall, Alta Loma, CA (US)

( * ) Notice: Subject to any disclaimer, the term of this patent is extended or adjusted under 35 U.S.C. 154(b) by 287 days.

(21) Appl. No.: 12/802,114

(22) Filed: May 29, 2010

(65) Prior Publication Data

US 2011/0291664 A1     Dec. 1, 2011

(51) Int. Cl.
*G01R 31/04* (2006.01)
(52) U.S. Cl. ............... 324/538; 324/756.05; 324/500
(58) Field of Classification Search .................. None
See application file for complete search history.

(56) References Cited

U.S. PATENT DOCUMENTS

| | | | |
|---|---|---|---|
| 5,945,838 A | 8/1999 | Gallagher et al. | |
| 5,949,243 A | 9/1999 | Grasso | |
| 6,005,402 A | 12/1999 | Grasso | |
| 6,194,908 B1 | 2/2001 | Wheel et al. | |
| 6,847,221 B2 | 1/2005 | Kimoto et al. | |
| 6,906,539 B2 | 6/2005 | Wilson et al. | |
| 6,922,069 B2 | 7/2005 | Jun | |
| 7,492,174 B2 | 2/2009 | Hall | |
| 7,581,962 B2 * | 9/2009 | Henry et al. | 439/71 |
| 7,815,473 B2 * | 10/2010 | Osato | 439/700 |

* cited by examiner

*Primary Examiner* — Jermele M Hollington
*Assistant Examiner* — Trung Nguyen
(74) *Attorney, Agent, or Firm* — Lewis M Brande; Thomas A McCleary; Brande & McCleary

(57) ABSTRACT

This invention describes a device for testing a surface mounted connector using a test probe assembly that utilizes a vacuum to force the test wires and the test probe's wire array into intimate contact with the connector to be tested. The wires are directed through a wire module assembly and have a wide spacing at one end, and a narrow spacing corresponding to the spacing required for the specific units to be tested at the opposite end. The wires are kept in contact with the unit under test by the use of spring loaded test connectors and vacuum.

12 Claims, 9 Drawing Sheets

DEVICE FOR TESTING SURFACE MOUNTED CONNECTORS

BACKGROUND OF THE INVENTION

Automatic test equipment for checking printed circuit boards has long involved the use of "bed of nails" test fixtures on which the circuit board is mounted during testing. A typical test fixture includes a large number of male-like spring-loaded test probes arranged to make electrical contact between measurement channels in the test equipment and designated test points on the circuit board under test, also referred to as the unit under test or UUT".

Any particular circuit laid out on a circuit board is likely to be different from other circuits, and consequently, the arrangement of the test probes for contacting the respective test points on the circuit board must be specifically customized in a test fixture for that specific circuit board.

The present invention relates to the testing of surface mounted connectors (SMC), which have been used increasingly on printed circuit boards. This invention has an array of probe pins that can easily contact the connectors of the SMC. The SMC contains an integrated circuit that must be tested while installed on the circuit board. This invention is mounted on a test plate located above a specific SMC. The test probe pins will contact a specific connector of the SMC when a vacuum is applied to a test fixture. The test fixture can be designed to accommodate more than one testing apparatus (i.e. the present invention).

DESCRIPTION

Brief Description of the Prior Art

U.S. Pat. No. 6,194,908 B1 by Wheel et al. describes a "Test Fixture for Testing Backplanes of Populated Circuit Boards". This invention includes a translator fixture having a plurality of spaced translator plates, that are adapted to support a number of translator pins, and a equal number of spring probes that extend through holes in a probe plate that are maintained in electrical contact with the translator pins and translate electrical signals.

FIG. 4 and seven are necessary for the preferred embodiment. Part numbers 134 and 137 are specifically defined as test probes, and are used to make electrical contact with the Unit Under Test "UUT". Even though the test probes are described as either sprung or solid, the common diameter is >1.3 mm, which is substantially greater than the present invention. Additionally, Wheel defines and describes his invention as testing circuit boards that "... have contact posts mounted in connectors having sidewalls which extend beyond the ends of the contact posts".

The present invention uses an array of solid wire <0.75 mm in diameter to test individual integrated circuits that are surface mounted, i.e SMU's or surface mounted units. These units are substantially smaller than what can be tested with the device disclosed and described by U.S. Pat. No. 6,194,908.

U.S. Pat. No. 6,005,402 by Grasso describes a "Translator Fixture for use in Circuit Board Testing". This invention shows that the tilt pins (214) contact the test probes (206). The translator fixture (202) has an array of holes and a pin retaining means (250). The pin retaining means creates a friction fit with the tilt pins preventing movement. The present invention by inventor Hall does not have this limitation.

In effect, the present invention allows for the movement of the wires within the test fixture. The essential thrust of the '402 patent is the ease of assembly of the translator fixture as opposed to the present invention, which among other things, is dedicated to the unique method of positional alignment of the array of test wires.

U.S. Pat. No. 5,945,838 by Gallagher et al. describes an "Apparatus for Testing Circuit Boards". The translator fixture contains " . . . standard translator pins such as tilt pins . . . extending through holes in the translator plates". "Preferably the tilt pins are straight, solid conductive pins, and extend through a pin retaining means". " . . . said plastic screen means apply a partial compression force around the circumference of the translator pins sufficient to retain the translator pins within the test fixture". The tilt pins contact conductive pins, which are slidably mounted in a guide assembly, which is friction fit into the top plate of the test fixture. The conductive pins are force fit into the block.

This patent is somewhat different that the present invention. The present invention allows direct contact of the test wires to the UUT, where this patent has tilt pins that contact the conductive pins, which in turn contact the UUT. Additionally, the '838 patent describes the diameters of the conductive pins as greater than 1.372 mm, which is substantially greater than the present invention. Additionally the present invention has direct contact from the spring loaded test probes to the UUT. The '838 patent in effect discloses and describes a different device than the present invention.

SUMMARY OF THE INVENTION

In accordance with the present invention, an apparatus is provided to test SMC's positioned on a circuit board. The apparatus has an array of very small diameter wires that are in contact with translator pins, where the translator pins provide positive resistance and, hence, force intimate contact with the connectors of the SMC when a vacuum is applied to the test fixture.

The apparatus has a series of alignment plates that are arranged in an array parallel to each other and essentially perpendicular to the test probe wires. The alignment plates provide support for the small diameter wires and also guides the array of test probe wires from a wide, "user-friendly" alignment plate at the top of the device to a very small alignment plate at the bottom of the device, where the apparatus connects to the test board above the SMC to test the circuit.

The alignment plate located above the SMC is co-axially aligned with the connectors of the SMC and provide better and more stable connectors to SMC's that are constantly being reduced in size, causing hardship with the manufacturers of the circuit boards. The present invention will eliminate the need to test each SMC on a circuit board individually and allow for simultaneous testing of all the SMC's on the board concurrently. The present invention uses extremely small diameter wire to provide a compact array of test probe wires that is necessary for the current generation of SMC's used in the electronics industry. The present invention is only limited by the ability to manufacture wire and an alignment plate having a sufficient array to properly engage the SMC to be tested.

DETAILED DESCRIPTION OF THE PREFERRED EMBODIMENT

Figure 1:
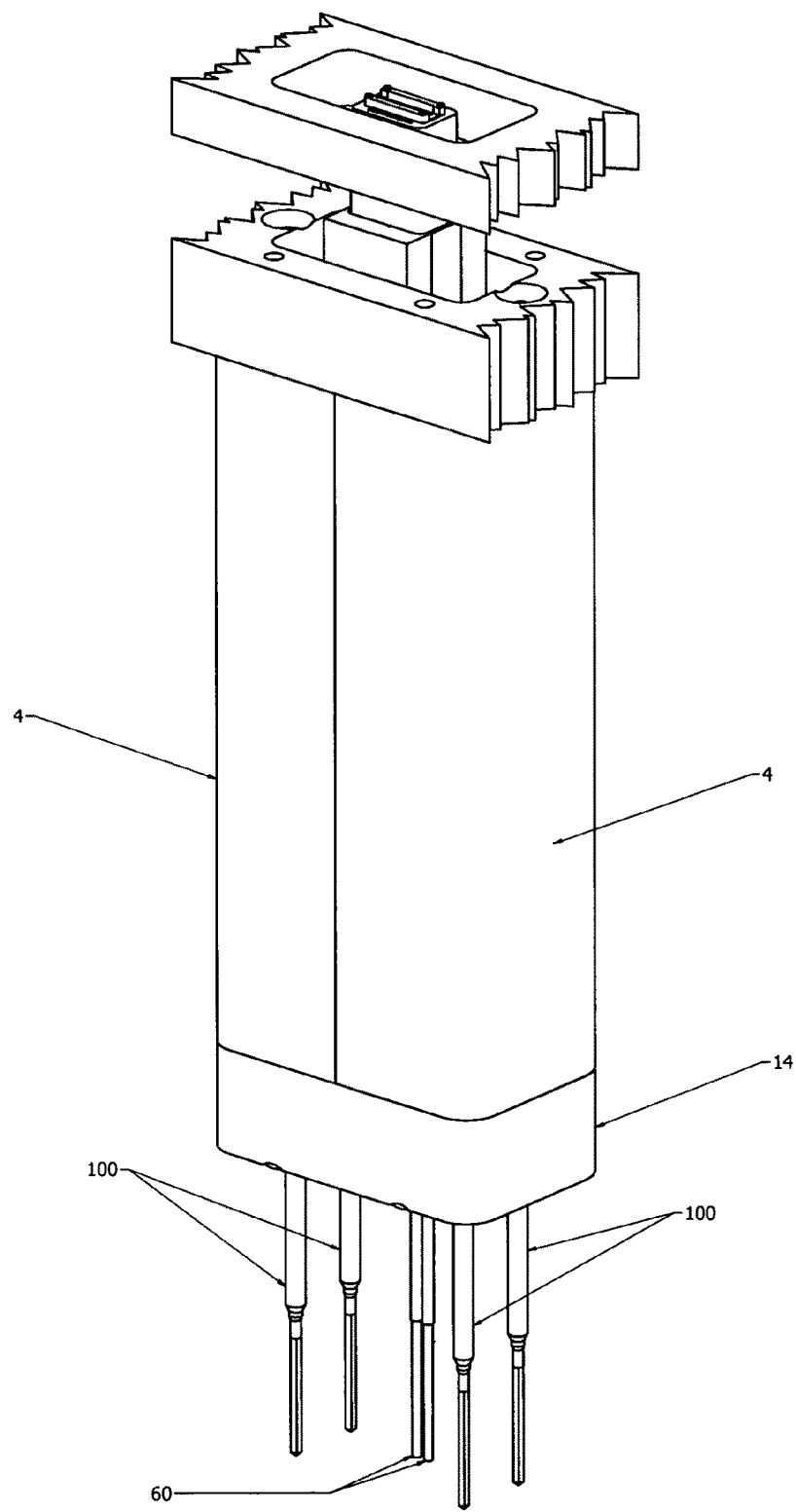
FIG. 1 shows an overall view of the Test Probe Assembly or Micro Probing Module.
Figure 2:
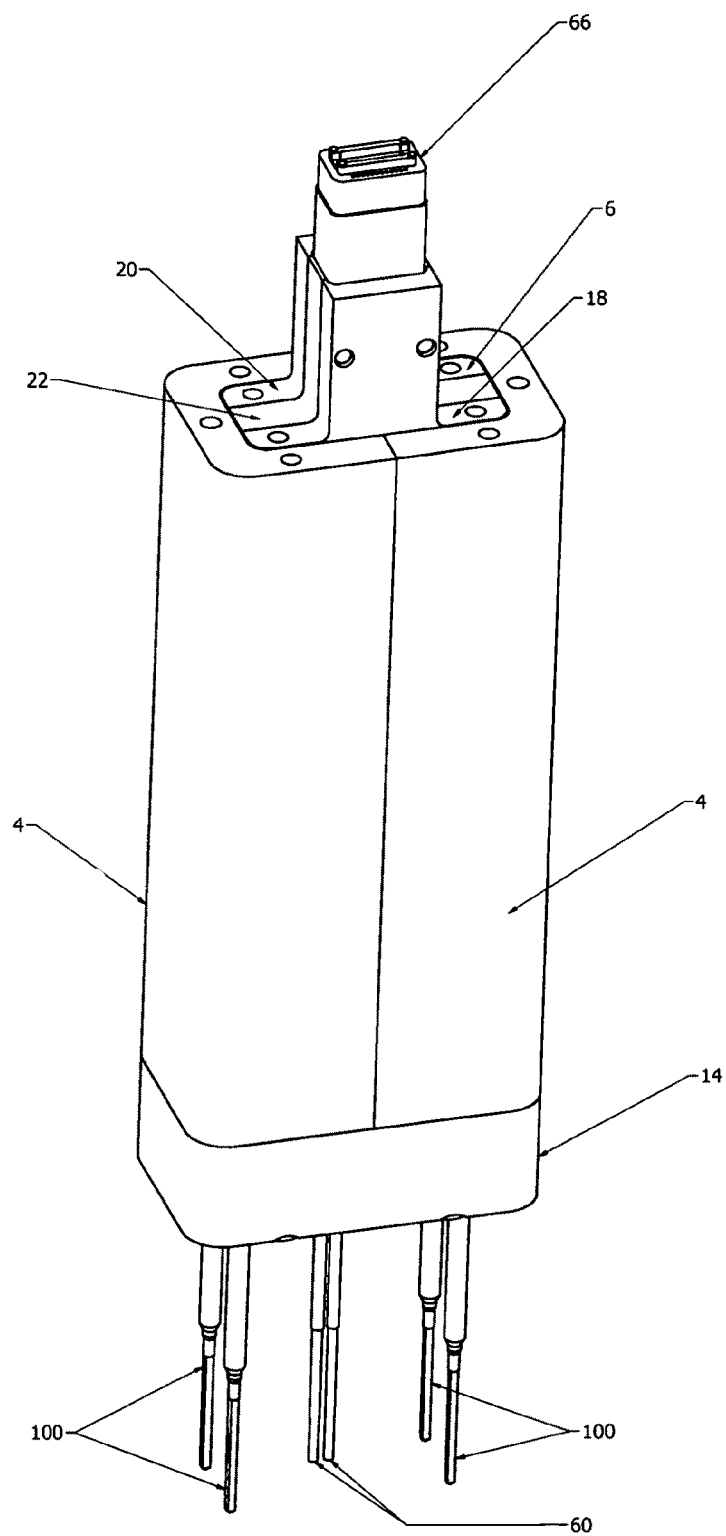
FIG. 2 is an overall view of the test probe assembly
Figure 3:
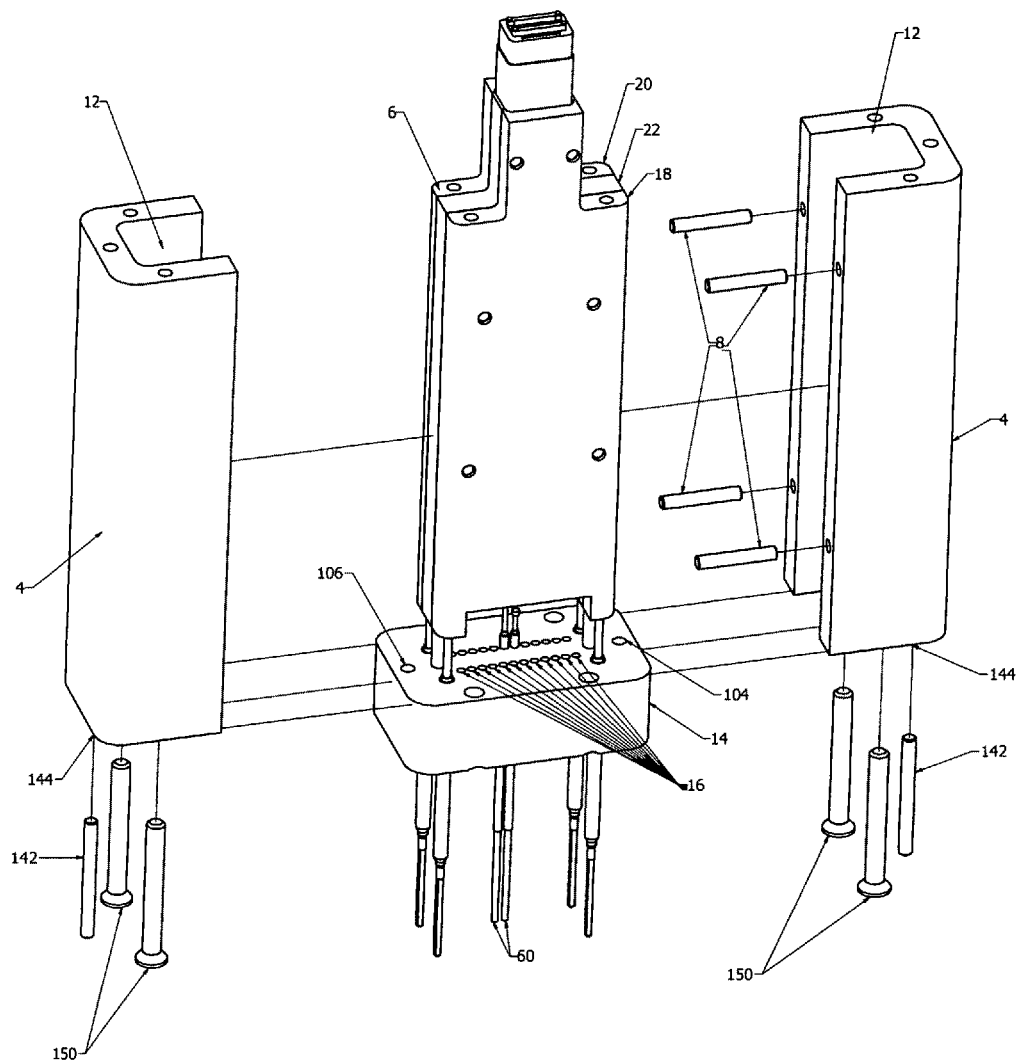
FIG. 3 shows an exploded view of the test probe assembly, showing the inner construction.
Figure 4:
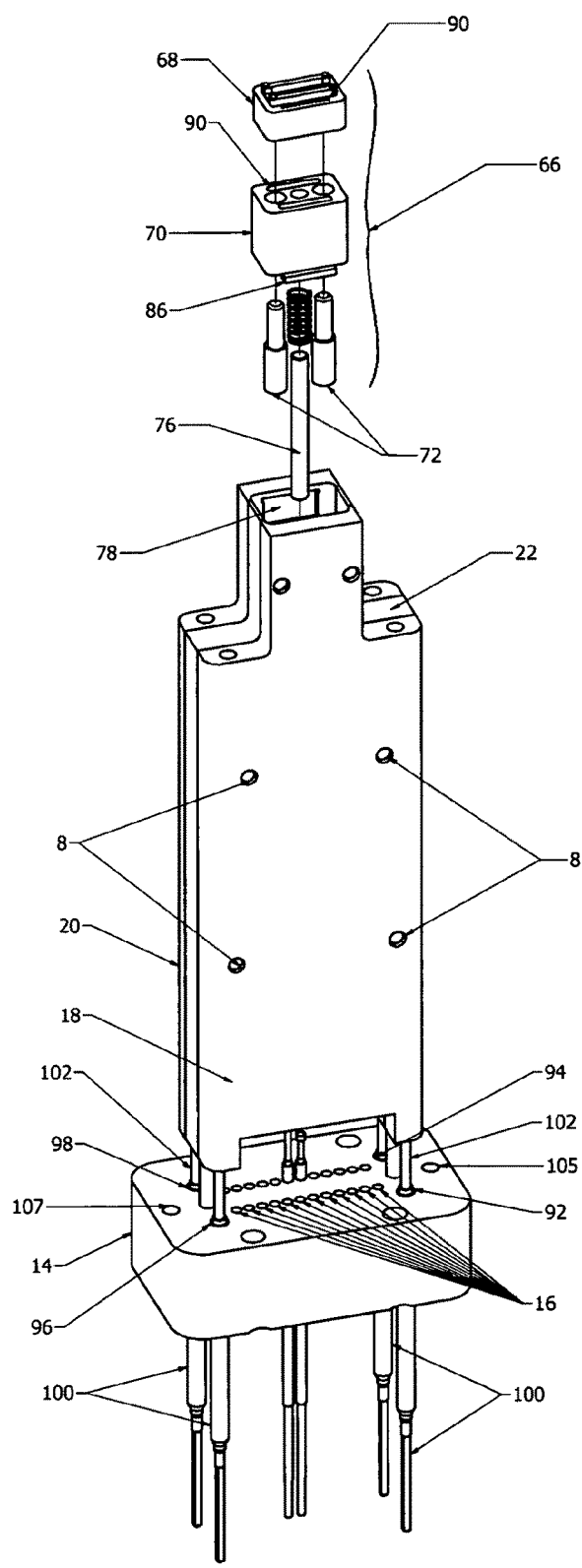
FIG. 4 shows a view of the test probe assembly without the shell.
Figure 5:
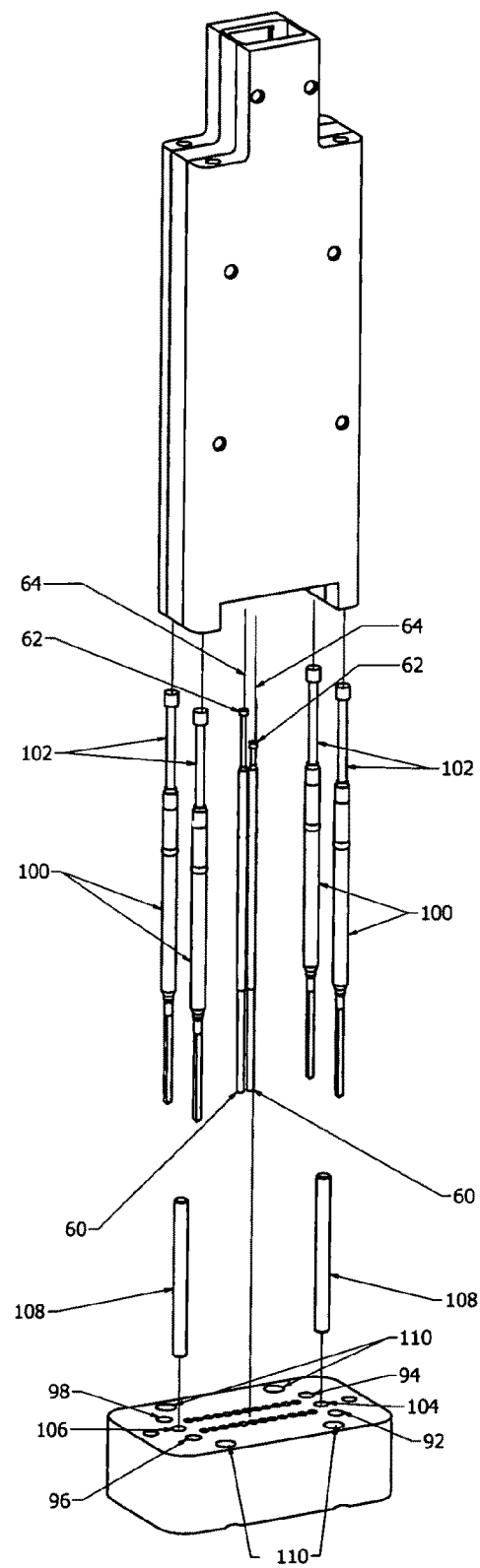
FIG. 5 shows the Probe Block separated from the Assembly and the springs that retain the Probe Block in position.
Figure 6:
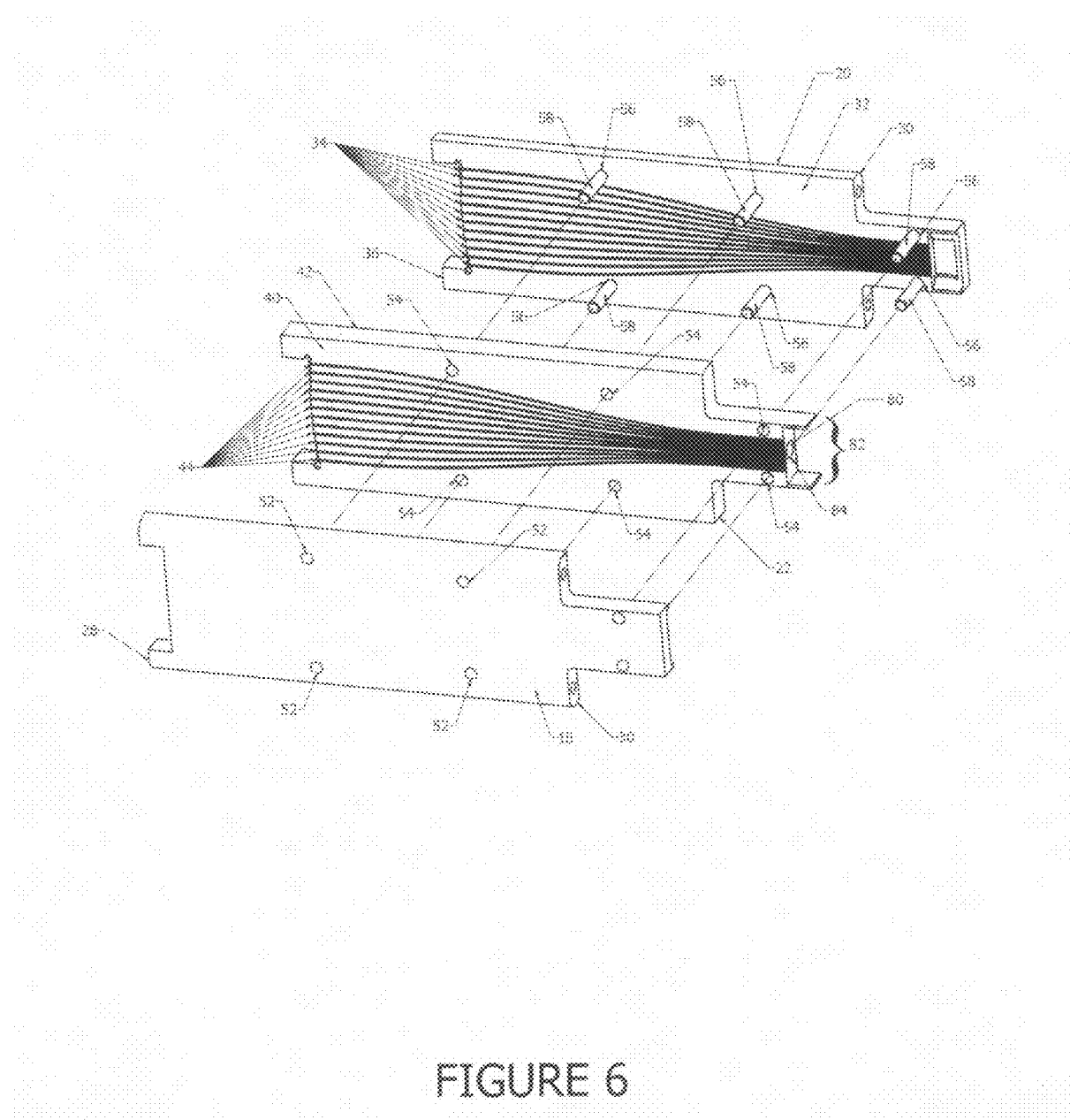
FIG. 6 shows an exploded view of the case assembly.
Figure 7:
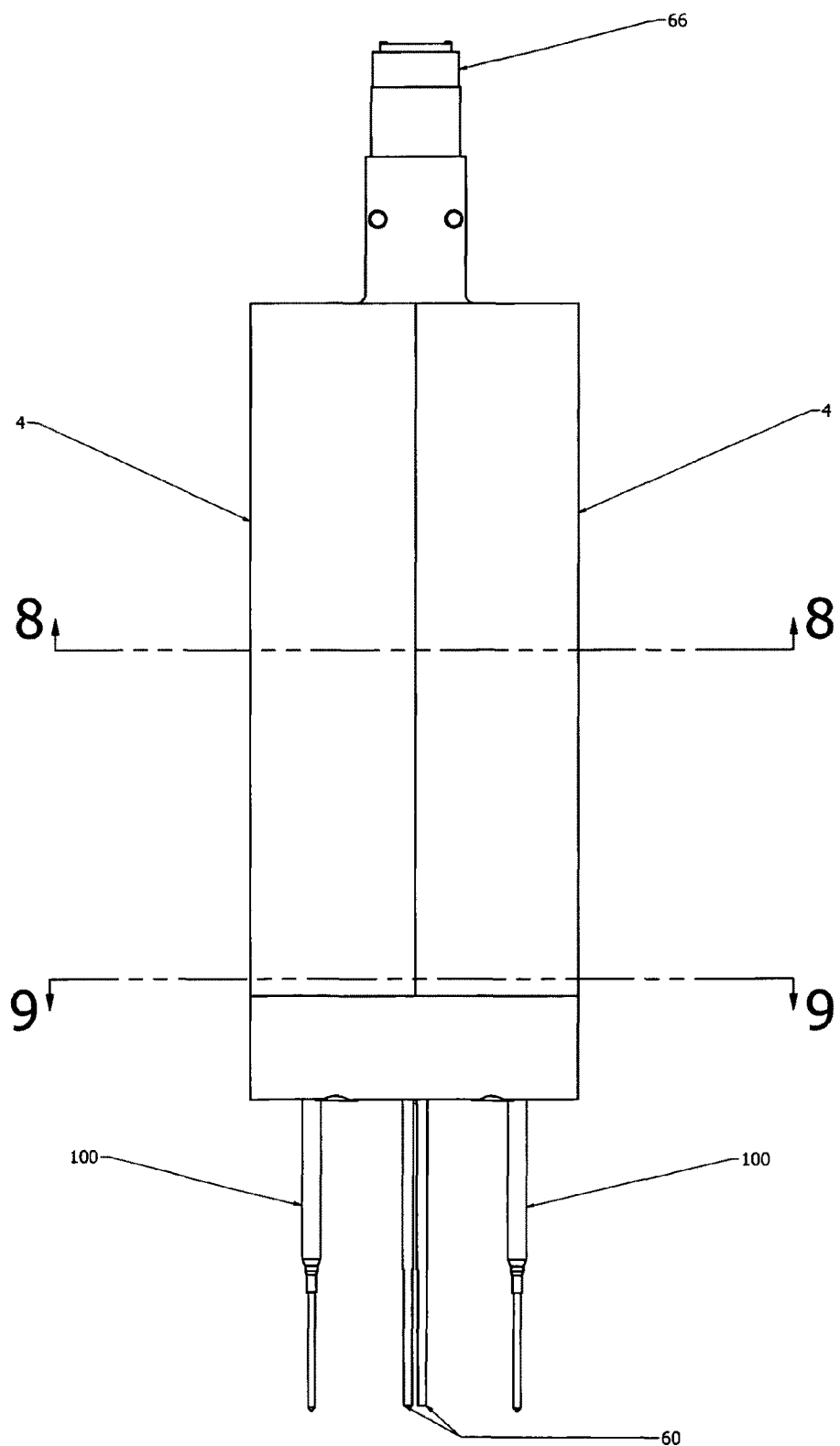
FIG. 7 shows a side view of the test probe assembly.
Figure 8:
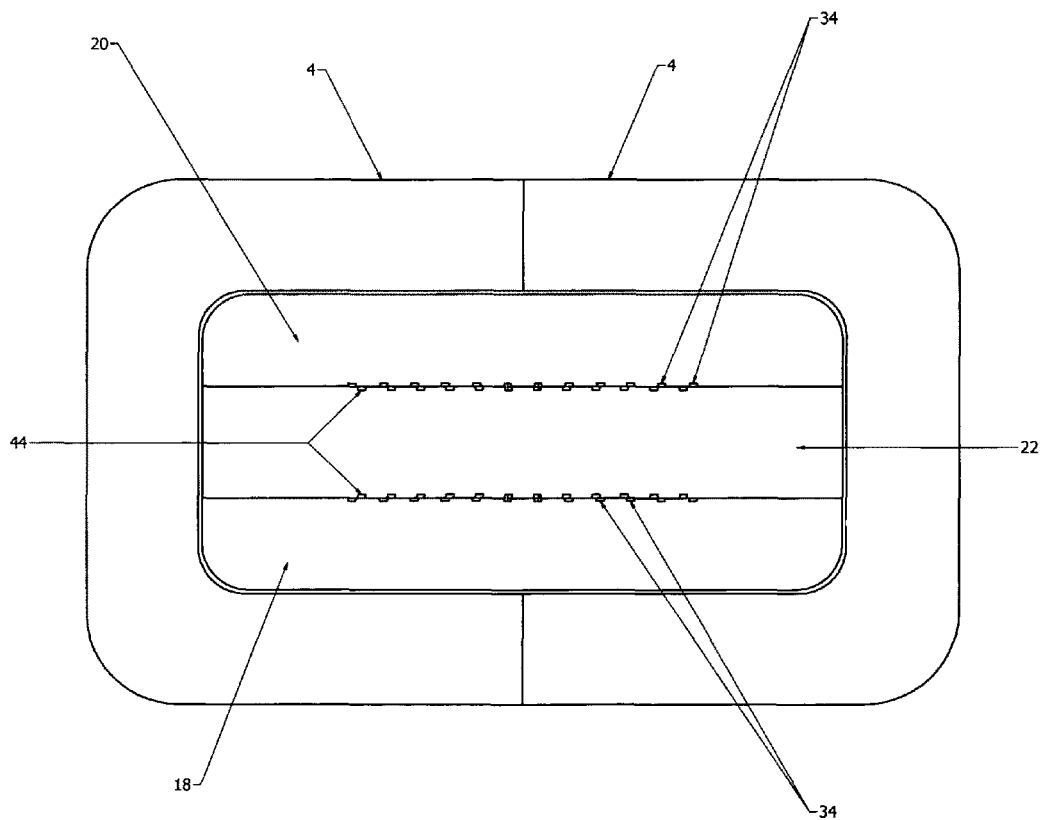
FIG. 8 is a mid-cross section of the test probe assembly.

Referring to FIGS. 1-9, an embodiment of the Test Probe Assembly or Micro Probing Module Assembly (2). The test probe assembly (2) comprises at least one guide plate (4), the guide plate (4) encompassing a wire module assembly (6). The present embodiment shows the test probe assembly (2) contains two guide plates (4) that surround the wire module assembly (6). The wire module assembly (6) is adapted to freely slide within the guide plate (4).

The present embodiment shows that the guide plates (4) are held in relative position to each other using a first set of guide pins (8). When assembled together (or if fabricated as one piece), the first set of guide pins (8) assure that the guide plate assembly (10), which comprises at the guide plates (4) and the first set of guide pins (8), creates an interior hollow (12) therebetween, allowing the wire module assembly (6) to freely slide therein.

The test probe assembly (2) contains a mounting plate (14), where the mounting plate (14) has a first array of holes (16) defined therein. The first array of holes (16) equals the number of wires necessary for the operation of the test probe assembly (2). The current requirements allow for the first array of holes (16) to contain 24, 36, or 38 holes, which is dependent upon the SMC to be tested.

The wire module assembly (6) contains a first module side (18), a second module side (20), and a case center (22). The first module side (18) has an interior side (24) the interior side (24) has a first series of grooves (26) embossed therein. The first module side (18) has a first end (28) and a second end (30). The first series of grooves (26) have a wide spacing at the first end (28), and a decreased spacing at the second end (30).

The second module side (20) has an interior side (32) and the interior side (32) has a second series of grooves (34) embossed therein. The second module side (20) has a first end (36) and a second end (38). The second series of grooves (34) has a wide spacing at the first end (36), and a decreased spacing at the second end (38).

The case center (22) is assembled interposed between the first module side (18) and the second module side (20). The case center (22) has a first side (40) and a second side (42). The first side (40) of the case center (22) has a third series of grooves (44) embossed therein. The third series of grooves (44) are minor opposites of the first series of grooves (26) in the first module side (18), and when assembled with the first module side (18) create a smooth first series of splinal holes (46) thereby.

The second side (42) of the case center (22) has a fourth series of grooves (48) embossed therein. The fourth series of grooves (48) are mirror opposites of the second series of grooves (34) in the second module side (20), and when assembled with the second module side (20) create a smooth second series of splinal holes (50) thereby.

The first module side (18) has a first set of dowel holes (52) defined therein. The case center (22) has a second set of dowel holes (54) defined therein. The second module side (20) has a third set of dowel holes (56) defined therein. The first, second, and third set of dowel holes (52, 54, 56) have coincident centers, allowing for a second set of dowel pins (58) to be frictionally set therein. The second set of dowel pins (58) secure the first module side (18), the case center (22), and the second module side (20) together.

The first array of holes (16) provides an interference fit to an array of spring-loaded test probes (60), where each hole in the array (16) contains a spring-loaded test probe (60). On one end (62) of each test probe (60) a wire (64) is attached. This wire (64) is connected to the test apparatus (not shown). Each spring-loaded test probe (60) allows a corresponding test probe wire (64) to come into intimate contact with the spring-loaded test probe (60).

The wire module assembly (6), when assembled creates a series of smooth splines. The smooth splines allow the test probe wire (64) to easily slide when force is exerted, causing intimate electrical contact with the test specimen.

The decreased spacing at the second end (30, 38), of the first and second module side (18, 20) respectively of the wire module assembly (6), ultimately defines the test probe wire's (64) position and number.

A tip assembly (66) is comprised of a top piece (68) where the top piece (68) is adapted to mount onto the SMC brackets. The top piece (68) is mounted on top of a compliance block (70). The compliance block (70) has a first pair of dowel holes (74) defined therein. The top piece (68) has a second pair of dowel holes (not shown) defined therein, where the second pair of dowel holes are in line with the first pair of dowel holes (74). The compliance block (70) and the top piece (68) are held together with a pair of retainer posts (72), the retainer posts (72) being frictionally inserted into the first and second set of dowel holes (74, not shown) respectfully. The compliance block (70) has a central hole defined therein (73) where the central hole (73) allows a dowel (76) to slide therein. When the wire module assembly (6) is assembled, the second ends (30, 28) of the first and second module sides (18, 20) create a cavity (78) thereby. The case center (22) has a second side (80) where the second side (80) has a cavity (82) machined therein. The second side (80) of the case center (22) has a central dowel hole (84) defined therein. The compliance block (70) has a lip (86) defined thereon, the lip (86) fits within the assembled cavity (78) of the wire module assembly (6).

The dowel (76) is slip fit into the central dowel hole (84) of the case center (22). A spring (88) is positioned over the dowel (76) and biases the tip assembly (66) towards the second side (80) of the case center (22). The top piece (68) and the compliance block (70) each have a second array of holes (90), where the second array of holes (90) provides the spacing for the wires (64) required for the test apparatus.

The mounting plate (14) is described as follows. The first array of holes (16) is shown as a rectangular pattern. The mounting plate (14) has a first, a second, a third, and a fourth (92, 94, 96, 98) hole defined therein, the first, second, third, and fourth (92, 94, 96, 98) holes are positioned in a rectangular array. A test probe (100) is inserted into each of the first, second, third, and fourth (92, 94, 96, 98) holes. The test probe (100) has a spring portion (102), where the spring portion (102) of the test probe (100) extends beyond the mounting plate (14). Spaced between the first and second (92, 94) holes is a fifth hole (104), and spaced between the third and fourth (96, 98) holes is a sixth hole (106). A third dowel (108) is frictionally inserted into each of the fifth and sixth holes (104, 106), extending beyond the mounting plate (14). The mounting plate (14) further has a series of through holes (110) defined therein. The mounting plate (14) has a long side (15) and a short side (17). The through holes (110) are located on the long side (15) of the mounting plate (14).

Figure 9:
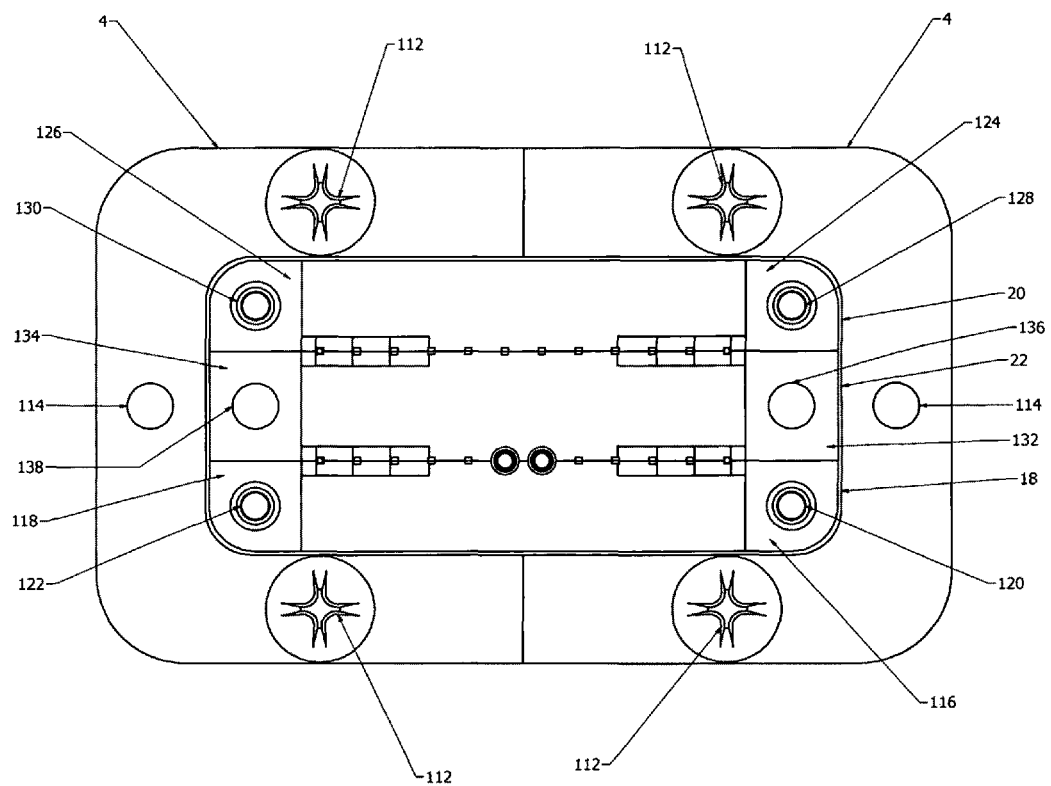
FIG. 9 is a lower cross section of the test probe assembly.

FIG. 9 shows a cross section of the test probe assembly (2) in close proximity to the mounting plate (14). Each guide plate (4) has a pair of holes (112) defined therein, each of the pair of holes (112) are coincident with each of the through holes (110) located along the long side (15) of the mounting plate (14). The guide plate (4) has a short side (5) and a long side (7). The guide plate has a hole (114) defined therein, the hole (114) being positioned on the short side (5) of the guide plate, and being coincident with the fourth and fifth hole (104, 106) in the guide plate (14).

As further shown in FIG. 9, the first end (28) of the first module side (18) has a third end (116) and a fourth end (118). The first module side (18) has a seventh hole (120) defined on the third end (116) and an eighth hole (122) defined on the fourth end (118). Similarly the first end (36) of the second module side (20) has a third end (124) and a fourth end (126). The second module side (20) has a ninth hole (128) defined on the third end (124) and a tenth hole (130) defined on the fourth end (130) of the second module side (20). The first side (40) of the case center (22) has a third end (132) and a fourth end (134). An eleventh hole (136) is defined on the third end (132) of the case center (22) and a twelfth hole (138) is defined on the fourth end (134) of the case center (22).

The wire module assembly (6) is assembled using the first module side (18) the case center (22) and the second module side (20). The first set of dowel holes (52) in the first module side (18) the second set of dowel holes (54) in the case center (22), and the third set of dowel holes (56) in the second module side (20), are aligned so that the second set of dowel pins (58) are frictionally set in each of the holes, creating the wire module assembly (6) which, when assembled, is viewed as a single block part. It can now bee seen that the wire module assembly (6) contains a first and second set of splinal holes (46,50), where the splinal holes (46, 50) are wide towards the mounting plate (14) and narrow towards the tip assembly (66).

Each guide plate (4) is aligned using the first set of dowel pins (8). Each guide plate (4) has at least 2 alignment holes (140) defined therein. The alignment holes (140) have coincident centers when the guide plates (4) are positioned opposed to each other. Each of the first set of dowel pins (8) is inserted into each corresponding alignment hole (140), and the guide plates (4) are pressed together, creating a shell. Each guide plate (4) has a bottom side (146), where the bottom side additionally has a second alignment hole (144) defined therein.

A fourth dowel (142) is inserted into each of the thirteenth hole (105) and fourteenth hole (107) in the mounting plate (14) and extends beyond the mounting plate (14). The second alignment hole (144) on the bottom side of each guide plate (4) is slid upon the fourth dowel (142) and the shell is secured to the mounting plate with fasteners (150). The first array of holes (16) has a spring loaded test probe (60) inserted therein. The wire module assembly (6) is inserted into the shell, and is allowed to slide. Test probes (100) provide a biasing means to allow the wire module assembly (6) to be maintained in an extended position. The third dowel (108) in the fifth and sixth hole (104, 106) provide linear stability to the wire module's (6) motion. The test probes (100) in the first array of holes (16) in the mounting plate (14) provide intimate contact with a wire (64) threaded through each of the splinal holes (46, 50). The tip assembly (66) is mounted in the cavity (78) in the wire module assembly (6) and biased in an extended position and has at least 1 dowel (76) to provide linear motion stability for the tip assembly (66). The top piece (68) has a second array of holes (90) that is pre-set to the position that will allow intimate contact with the component to be tested.

What is claimed is:

1. A device for testing surface connectors comprising:
   a. a pair of guide plates, a wire module assembly and a mounting plate, said pair of guide plates having means to be aligned, said aligned guide plates being pressed together creating a shell thereby;
   b. said wire module assembly comprises a first module side, a second module side and a case center, said first module side has an interior side said interior side has a first series of grooves embossed therein, said first series of grooves has a wide spacing at a first end of said first module side, and a decreased spacing at a second end of said first module side, said second module side has an interior side, said interior side has a second series of grooves embossed therein, said second series of grooves have a wide spacing at a first end of said second module side, and a decreased spacing at a second end of said second module side, said case center is assembled interposed between said first module side and said second module side, said case center has a first side and a second side, said first side of said case center has a third series of grooves embossed therein, said third series of grooves are mirror opposites of said first series of grooves in said first module side, and when assembled with said first module side a smooth first series of splinal holes are created thereby, said second side of said case center has a fourth series of grooves embossed therein, said fourth series of grooves are mirror opposites of said second series of grooves in said second module side, and when assembled with said second module side a smooth second series of splinal holes are created thereby;
   c. said first module side, said second module side and said case center have a means to align and secure each other;
   d. a tip assembly is comprised of a top piece where said top piece is adapted to mount onto surface mounted connector brackets, said top piece is mounted on top of a compliance block, said compliance block has a first pair of dowel holes defined therein, said top piece has a second pair of dowel holes defined therein, said second pair of dowel holes are in line with said first pair of dowel holes, said compliance block and said top piece are held together with a pair of retainer posts, said retainer posts are frictionally inserted into said first and said second set of dowel holes respectfully, said compliance block has a central hole defined therein, said central hole allows a dowel to slide therein, when assembled, said wire module assembly, defines a cavity at said second ends of said first and said second module sides thereby, said case center has a second side where said second side has a cavity defined therein, said second side of said case center has a central dowel hole defined therein, said compliance block has a lip defined thereon, said lip fits within said cavity of said wire module assembly;
   e. said dowel is slip fit into said central dowel hole of said case center, a biasing means is positioned over said dowel and biases said tip assembly towards said second side of said case center, said top piece and said compliance block each have a second array of holes defined therein, said second array of holes provides the required spacing for the wires necessary for the test apparatus;
   f. said mounting plate has a first array of holes defined therein, said first array of holes has a rectangular pattern, said mounting plate has a first, a second, a third, and a fourth hole defined therein, said first, said second, said third, and said fourth holes are positioned in a rectangular array, a test probe is inserted into each of said first, said second, said third, and said fourth holes, said test probe has a spring portion defined thereon, said spring portion of said test probe extends beyond said mounting plate, said mounting plate has a fifth hole and a sixth hole defined therein, said fifth hole is inter spaced between said first and said second holes, said sixth hole is inter spaced between the third and fourth holes, a third dowel is frictionally inserted into each of the fifth and sixth holes extending beyond said mounting plate, said mounting plate has a series of through holes defined therein, said mounting plate has a long side and a short side, said through holes are located on said long side of said mounting plate;

g. each of said guide plates has a pair of holes defined therein, each of said pair of holes are coincident with each of said through holes located along said long side of said mounting plate, said guide plate has a short side and a long side defined therein, said guide plate additionally has a hole defined therein, said hole being positioned on said short side of said guide plate and being coincident with said fourth and fifth hole in the guide plate; and h. said first end of said first module side has a third end and a fourth end, said first module side has a seventh hole defined on said third end and an eighth hole defined on said fourth end, said first end of said second module side has a third end and a fourth end, said second module side has a ninth hole defined on said third end and a tenth hole defined on said fourth end of said second module side, said first side of said case center has a third end and a fourth end, an eleventh hole is defined on said third end of said the case center and a twelfth hole is defined on said fourth end of said case center.

2. The device for testing surface connectors in claim 1 wherein each guide plate has at least 2 alignment holes defined therein, said alignment holes having coincident centers when said guide plates oppose each other, said means to align said guide plates comprises a first set of guide pins, said first set of guide pins being inserted into each corresponding alignment hole, said guide plates when pressed together create a shell thereby.

3. Each guide plate is aligned using the first set of dowel pins, each guide plate has at least 2 alignment holes defined therein, each of the first set of dowel pins is inserted into each corresponding alignment hole, and the guide plates are pressed together, creating a shell thereby.

4. The device for testing surface connectors in claim 1 wherein said first module side has a first set of dowel holes defined therein, said case center has a second set of dowel holes defined therein, said second module side has a third set of dowel holes defined therein said first, said second, and said third set of dowel holes have coincident centers, allowing for a second set of dowel pins to be frictionally set therein, said second set of dowel pins secures said first module side of said case center, and said second module side together, said means to align said guide plates comprises a first set of guide pins.

5. The device for testing surface connectors in claim 1 wherein said biasing means is a spring.

6. The device for testing surface connectors in claim 1 wherein said means to align said first and second module side to said case center comprises said first and second case centers having dowel holes defined therein, said case center having dowel holes defined therein, said dowel holes in said first and said second module sides and said case center having coincident centers, allowing for a second set of dowel pins to be frictionally set therein, said second set of dowel pins secure said first module side, said case center, and said second module side together.

7. A device for testing surface connectors comprising:

a. a pair of guide plates, a wire module assembly and a mounting plate, said pair of guide plates having means to be aligned, said aligned guide plates being pressed together creating a shell thereby;

b. said wire module assembly comprises a first module side, a second module side and a case center, said first module side, said second module side and said case center having means to be aligned, said first module side, said second module side and said case center when aligned and pressed together have a first and second series of splinal holes defined therein, said splinal holes having a wide spacing at one end and a narrow spacing at an opposing end;

c. a tip assembly, said tip assembly is comprised of a top piece where said top piece is adapted to mount onto SMC brackets, said tip assembly has a central hole defined therein, said central hole allowing a dowel to slide therein, when assembled, said wire module assembly defines a cavity at a second end of said first and said second module sides, said second side of said case center has a central dowel hole defined therein, said tip assembly has a lip defined thereon, said lip fits within said cavity of said wire module assembly;

d. an alignment means and a biasing means, said alignment means and said biasing means positions and aligns said tip assembly towards said second side of said case center, said tip piece has a second array of holes defined therein, said second array of holes provides the spacing required for the wires necessary for the test apparatus;

e. said mounting plate has a first array of holes defined therein, said first array of holes having a rectangular pattern, said mounting plate has a biasing means said biasing means being adapted for said wire module assembly, said mounting plate also has an alignment means for said wire module assembly; and f. said first array of holes each has a spring loaded test probe inserted therein, each spring loaded test probe is adapted to contact a wire, said wire smoothly sliding in each of said first and said second series of splinal holes, said guide plates are secured to said mounting plate, said wire module assembly is slideably inserted into said shell and is biased and aligned providing a stable slideable motion thereby.

8. The device for testing surface connectors in claim 7, wherein, each guide plate has at least 2 alignment holes defined therein, said alignment holes having coincident centers when said guide plates are positioned opposing each other, said means to align said guide plates comprises a first set of guide pins, said first set of guide pins being inserted into each corresponding alignment hole.

9. The device for testing surface connectors in claim 7, wherein, said means to align said first and said second module sides to said case center comprises said first and said second case centers having dowel holes defined therein, said case center having dowel holes defined therein, said dowel holes in said first and said second module sides and said case center each having coincident centers, allowing for a second set of dowel pins to be frictionally set therein, said second set of dowel pins secures said first module side, said case center, and said second module side together.

10. The device for testing surface connectors in claim 7, wherein, said alignment means for said tip assembly is a dowel, said dowel is slip fit into said central dowel hole of said case center.

11. The device for testing surface connectors in claim 7, wherein, said biasing means for said tip assembly is a spring, said spring is positioned over said alignment means and biases said tip assembly towards the second side of said case center.

12. The device for testing surface connectors in claim 7, wherein, said biasing means for said mounting plate comprises said mounting plate having a first, a second, a third, and a fourth hole defined therein, said first, said second, said third, and said fourth holes are positioned in a rectangular array, a test probe is inserted into each of said first, said second, said third, and said fourth holes, said test probe has a spring portion defined thereon, said spring portion of said test probe extends beyond said mounting plate, said alignment means for said mounting plate comprises said alignment plate having a fifth hole and a sixth hole defined therein, said fifth hole is interspaced between said first and said second holes, said sixth hole is interspaced between said third and said fourth holes, a third dowel is frictionally inserted into each of said fifth and said sixth holes extending beyond said mounting plate, said mounting plate further has a series of through holes defined therein, said mounting plate has a long side and a short side, said through holes are located on said long side of said mounting plate.

* * * * *